United States Patent [19]

Nakadai

[11] Patent Number: 5,684,723
[45] Date of Patent: Nov. 4, 1997

[54] DEVICE SIMULATION METHOD AND DEVICE SIMULATOR

[75] Inventor: Takako Nakadai, Kawasaki, Japan

[73] Assignee: Fujitsu Limited, Kawasaki, Japan

[21] Appl. No.: 322,367

[22] Filed: Oct. 13, 1994

Related U.S. Application Data

[63] Continuation of Ser. No. 206,259, Mar. 7, 1994, abandoned, which is a continuation of Ser. No. 82,425, Jun. 28, 1993, abandoned, which is a continuation-in-part of Ser. No. 754,451, Sep. 3, 1991, abandoned, which is a continuation of Ser. No. 653,735, Feb. 11, 1991, abandoned, which is a continuation of Ser. No. 270,032, Nov. 14, 1988, abandoned.

[30] Foreign Application Priority Data

Nov. 16, 1987 [JP] Japan ................................. 62-288723

[51] Int. Cl.$^6$ ............................................ G06F 17/50
[52] U.S. Cl. ......................... 364/578; 364/488; 395/500
[58] Field of Search .......................... 364/488, 489, 364/490, 578; 395/500

[56] References Cited

U.S. PATENT DOCUMENTS

| | | | |
|---|---|---|---|
| 4,510,616 | 4/1985 | Lougheed et al. | 364/490 |
| 4,615,011 | 9/1986 | Linsker | 364/491 |
| 4,703,436 | 10/1987 | Varshney | 364/490 |
| 4,748,660 | 5/1988 | Deveze | 364/514 |
| 4,754,408 | 6/1988 | Carpenter et al. | 364/488 |

(List continued on next page.)

OTHER PUBLICATIONS

Nasecode IV, Proceedings of hte Fourth International Conference on the Numerical Analysis of Semiconductor Devices and Integrated Circuits, Jun. 19–21, 1985, Dublin, Ireland, "Device Simulation Code for Vector Processor", George Abe et al., pp. 123–129.

Denshi Tsushin Gakkai Ronbunshi, 86/11, vol. J69C, No. 11, "High Convergence Matrix Solving Scheme for Device Simulator", by Satou et al., (1986), pp. 1389–1396.

IEEE Transactions On Electron Devices, vol. ED–32, No. 10, Oct. 1985, "Three–Dimensional Device Simulator Caddeth with Highly Convergent Matrix Solution Algorithyms", by Toyabe et al.

Electronic Letters, Jul. 22, 1981, vol. 18, No. 15, "Generalised ICCG mMethod for Solution of Asymmetric, Sparse, Linear Systems of Discretised Semiconductor Device Equations", by Chang et al.

Physics of Semiconductor Devices, 2nd Edition, "Static Characteristics (Basic Current–Voltage Relationship)", by S.M. Sze.

Primary Examiner—Emanuel T. Voeltz
Assistant Examiner—Kyle J. Choi
Attorney, Agent, or Firm—Staas & Halsey

[57] ABSTRACT

A simulation method for obtaining internal information at discrete points within a semiconductor device to be analyzed based on information related to the semiconductor device by forming a coefficient matrix A having matrix equation A·X=b with respect to each of the discrete points within the semiconductor device and solving the matrix equation. X denotes a matrix of physical quantities to be obtained and b is a known matrix. The device simulation method includes the steps of (a) assigning a rectangular work region to the semiconductor device regardless of its shape so that it fits within the work region, (b) forming a matrix of elements with respect to each of the discrete points within the analyzing region and dummy elements with respect to each of the discrete points within a non-analyzing region at least within the work region. The dummy element have values substituted into the matrix such that they form a diagonal term of the matrix respectively with a positive integer and remaining dummy elements respectively are "0", (c) forming a matrix (L·U) by dividing the matrix into lower and upper triangular matrices L and U, (d) calculations using a stored iteration method and the specific matrix (L·U) until a convergence condition is satisfied, to obtain a solution for each element of the matrix X, and (e) determining, using the solution for each element of the matrix X, whether the semiconductor device is operational.

27 Claims, 10 Drawing Sheets

U.S. PATENT DOCUMENTS

| | | | |
|---|---|---|---|
| 4,791,593 | 12/1988 | Hennion | 364/578 |
| 4,805,113 | 2/1989 | Ishii et al. | 364/489 |
| 4,815,003 | 3/1989 | Patatunda et al. | 364/488 |
| 4,827,428 | 5/1989 | Dunlop et al. | 364/488 |
| 4,939,681 | 7/1990 | Yokomizo et al. | 364/578 |
| 4,969,116 | 11/1990 | Wada et al. | 364/488 |

FIG. 1
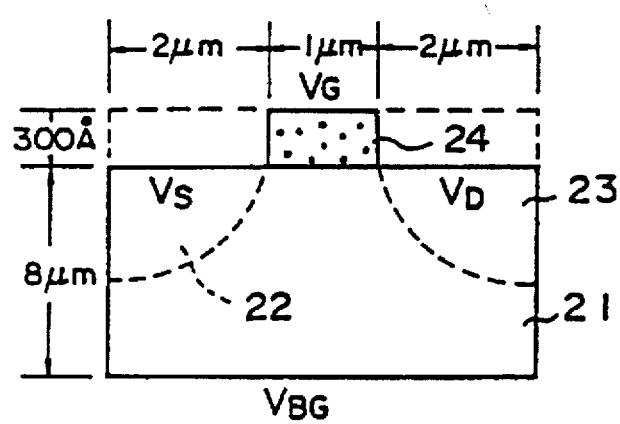
FIG. 2
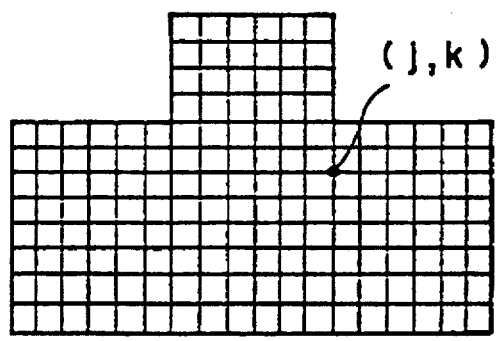
FIG. 3
$$\begin{pmatrix} A1 & A3 & A5 & \\ A2 & & A5 & \\ A4 & & & \\ & A4 & & \end{pmatrix} \times \begin{pmatrix} | \\ V \\ | \end{pmatrix} = \begin{pmatrix} | \\ Ab \\ | \end{pmatrix}$$

DEVICE SIMULATION METHOD AND DEVICE SIMULATOR

This is a continuation of application Ser. No. 08/206,259, filed Mar. 7, 1994, now abandoned, which is a continuation of application Ser. No. 08/082,425, filed Jun. 28, 1993, abandoned, which is a continuation-in-part of application Ser. No. 07/754,451, filed Sep. 3,1991, abandoned, which is a continuation of application Ser. No. 07/653,735, filed Feb. 11, 1991, abandoned, which is a continuation of application Ser. No. 07/270,032, 14, 1988, abandoned.

BACKGROUND OF THE INVENTION

The present application is a Continuation-In-Part Application of the U.S. patent application Ser. No. 653,735 which is a File-Wrapper-Continuation Application of the U.S. patent application Ser. No. 270,032 filed Nov. 14, 1988.

The present invention generally relates to device simulation methods and device simulators, and more particularly to a device simulation method and a device simulator for analyzing parameters of a semiconductor device by solving simultaneous equations indicative of an operation of the semiconductor device by using an iteration method.

In order to improve the integration density and response speed of a semiconductor device such as a very large scale integrated circuit (VLSI), it is necessary to miniaturize the semiconductor device. But in miniaturizing the semiconductor device, it is difficult both timewise and costwise to develop elements on the order of submicrons based on experience.

Accordingly, in research and development of the semiconductor device such as the VLSI, a device simulator is used to grasp an internal state and an external characteristic of the semiconductor device in advance by a device simulation. The requirements of the device simulator are that the analysis can be made with a high convergence, high accuracy and high speed with respect to a semiconductor device of any structure and shape.

A description will now be given of a case where a metal oxide semiconductor field effect transistor (MOSFET) shown in FIG. 1 is the semiconductor device to be analyzed by the device simulator. For example, a source region 22 and a drain region 23 are respectively formed to a width on the order of 2 μm on a substrate 21 which has a thickness of 8 μm. In addition, an oxide layer 24 made of silicon dioxide ($SiO_2$) is formed to have a width of 1 μm and a thickness on the order of 300 Å. In this case, the inside of the MOSFET is described by three fundamental equations, namely, the Poisson's equation (1), the electron current continuity equation (2) and the hole current continuity equation (3), where $\epsilon$ denotes a dielectric constant, V denotes a potential, q denotes a charge quantity, $N_d$ denotes a donor density, $N_a$ denotes an acceptor density, p denotes a hole density, n denotes an electron density, $J_p$ and $J_n$ respectively denote hole and electron current densities, and U denotes a generation and recombination term.

$$\epsilon(\nabla^2 \cdot V) = -q(N_d + N_a + p - n) \quad (1)$$

$$\frac{\partial p}{\partial t} = -(1/q)\nabla J_p + U \quad (2)$$

$$\frac{\partial n}{\partial t} = (1/q)\nabla J_n + U \quad (3)$$

The Poisson's equation (1) indicates that a total flux of an electric field E ($=\nabla V$) passing through a closed curved surface is equal to a total charge within the closed curved surface. The electron and hole current continuity equations (2) and (3) indicate that an increment of the current (density) in a certain minute interval is equal to a change in the carriers with respect to time in the region.

The potential V, the hole density p and the electron density n are obtained by solving the equations (1) through (3), but a discretization is carried out by use of the finite difference calculus because it is difficult to solve the second partial differential equation. In the Poisson's equation (1), the hole density p and the electron density n in the right hand term are functions of the potential V and the equation is non-linear. For this reason, the equation is linearized by use of the Newton method.

In other words, as shown in FIG. 2 which shows an analyzing region of the MOSFET which is to be analyzed, the analyzing region of the inside of the MOSFET is divided into a plurality of rectangular meshes to suppose a plurality of discrete points (or grids) at intersections of the meshes, and physical quantities at each discrete point are described along with the surrounding physical quantities. For example, a potential $V_{jk}$ at an arbitrary discrete point (j·k) can be described by the following equation (4) by use of the equation (1) and potentials $V_{(j-1)k}$, $V_{j(k-1)}$, $V_{j(k+1)}$ and $V_{(j+1)k}$ which are other than the potential $V_{jk}$.

$$A1_{jk} \cdot V_{jk} - A2_{jk} \cdot V_{(j-1)k} - A3_{jk} \cdot V_{(j-1)k} - A4_{jk} \cdot V_{j(k-1)} - A5_{jk} \cdot V_{j(k+1)} = A6 \quad (4)$$

Similarly, when the equation (4) is obtained for each of the other discrete points, it is possible to obtain a matrix equation shown in FIG. 3 which may be represented by the following matrix equation (5).

$$A \cdot V = b \quad (5)$$

Conventionally, a matrix equation similar to the matrix equation (5) is also obtained by the discretization with respect to each of the electron and hole current continuity equations (2) and (3).

As methods of solving the matrix equation (5), there are the direct methods such as the Gaussian relaxation method and the Crout method, and the iteration methods such as the successive overrelaxation (SOR) method and the incomplete LU decomposition conjugate gradient squared (ILUCGS) method.

The direct methods obtain an inverse matrix $A^{-1}$ and obtain the elements (potentials at each of the discrete points) of the matrix V from $A^{-1} \cdot b$. It is possible to obtain a strict solution through a finite number of operations when there is no rounding error. Even when obtaining an approximate solution, the required number of operations is determined substantially regardless of the desired accuracy.

On the other hand, the indirect methods start from one approximate solution and obtain a more accurate solution with every reiteration. However, even if there were no rounding error, it is necessary to carry out the reiteration an infinite number of times in order to obtain a strict solution, and the accuracy of the solution is therefore dependent on the number of reiterations.

According to the direct method, it is necessary to obtain the inverse matrix $A^{-1}$, but this inverse matrix $A^{-1}$ is a large matrix which is sparse. For this reason, the amount of calculation, the required memory capacity and the calculation time become extremely large. Hence, the solution is conventionally obtained by the iteration method without the use of the inverse matrix $A^{-1}$.

On the other hand, according to the iteration method, the coefficient matrix A of the matrix equation (5) is used. The shape (or structure) of the semiconductor device (that is, the MOSFET in this case) to be analyzed is input, and the coefficient matrix A is obtained for the discrete points inside the semiconductor device. For this reason, in the case of the MOSFET shown in FIG. 1, the period of the coefficient matrix A changes depending on the shape of the oxide layer 24 and there is a problem in that this method is not suited for general applications.

In addition, a boundary region forming an outer edge of the semiconductor device is conventionally assumed to be formed of non-discrete points, and no analysis is made with respect to the boundary region.

Furthermore, since the semiconductor device is becoming further miniaturized and the integration density is increasing rapidly by the recent technological developments, the impurity distribution and element structure are becoming more and more complex thereby resulting in a large change in the electric field and carrier density depending on the location within the semiconductor device. Therefore, the degree of non-symmetry and non-positive definiteness become large, and the convergence becomes insufficient. Consequently, the calculation time becomes long and the solution cannot be obtained in some cases.

SUMMARY OF THE INVENTION

Accordingly, it is a general object of the present invention to provide a novel and useful device simulation method and device simulator in which the problems described above are eliminated.

Another and more specific object of the present invention is to provide a device simulation method and device simulator for analyzing a semiconductor device at a high speed regardless of the structure and shape of the semiconductor device.

Still another object of the present invention is to provide a device simulation method implemented in a computer for obtaining internal information at discrete points within a semiconductor device which is to be analyzed based on information related to the semiconductor device by forming a coefficient matrix A of a matrix equation A·X=b of physical equations with respect to each of the discrete points within the semiconductor device and solving the matrix equation, where X denotes a matrix of physical quantities to be obtained and b is a known matrix, and the device simulation method comprises the steps of (a) assigning a rectangular work region to the semiconductor device regardless of a shape of the semiconductor device, where the semiconductor device is fit within the work region and occupies an analyzing region within the work region where the semiconductor device is located, (b) forming, in the computer, a matrix made up of elements with respect to each of the discrete points within the analyzing region of the work region of the semiconductor device and dummy elements with respect to each of the discrete points within a non-analyzing region unoccupied by the semiconductor device at least within the work region, where the dummy elements have values substituted into the matrix such that the values of the dummy elements forming a diagonal term of the matrix respectively are a positive integer and remaining dummy elements respectively are "0", (c) forming, in the computer, a matrix (L·U) by dividing the matrix into a lower triangular matrix L and an upper triangular matrix U, (d) carrying out, in the computer, calculations in conformance with an iteration method stored therein by use of the specific matrix (L·U) until a convergence condition is satisfied, thereby obtaining a solution for each element of the matrix X, and (e) determining, using the solution for each element of the matrix X obtained in the step (d), whether or not the semiconductor device is operational. According to the device simulation method of the present invention, it is possible to obtain the solution at a high speed.

A further object of the present invention is to provide a computer-implemented device simulator for obtaining internal information at discrete points within a semiconductor device which is to be analyzed based on information related to the semiconductor device, comprising an input device for inputting information related to the semiconductor device including at least structural information on a shape of the semiconductor device and information on analyzing condition, initial condition input means, operatively coupled to the input device, for inputting simulation initializing conditions including initial values based on the information input from the input device, matrix forming means for forming a coefficient matrix A of a matrix equation A·X=b of physical equations with respect to each of the discrete points within the semiconductor device and solving the matrix equation by calculations initially using the initial values included in the simulation initializing conditions, where X denotes a matrix of physical quantities to be obtained and b is a known matrix, and the matrix forming means includes means for assigning a rectangular work region to the semiconductor device regardless of a shape of the semiconductor device so that the semiconductor device is fit within the work region and occupies an analyzing region within the work region, which analyzing region is a region within the work region where the semiconductor device is located and means for forming a matrix made up of elements with respect to each of the discrete points within the analyzing region of the work region and dummy elements with respect to each of the discrete points within a non-analyzing region unoccupied by the semiconductor device at least within the work region, where the dummy elements have such values that the dummy elements forming a diagonal term of the matrix respectively are a positive integer and remaining dummy elements respectively are "0", processing means, operatively coupled to the matrix forming means, for forming a specific matrix (L·U) by dividing the matrix into a lower triangular matrix L and an upper triangular matrix U, calculation means, operatively coupled to the processing means, for carrying out calculations in conformance with an iteration method by use of the specific matrix (L·U) until a convergence condition is satisfied, thereby obtaining a solution for each element of the matrix X, and control means, operatively coupled to the initial condition input means, the matrix forming means, the processing means and the calculation means, for controlling operation sequences of the initial condition input means, the matrix forming means, the processing means and the calculation means. The control means generates at least an instruction for transferring data of the matrix formed in the matrix forming means to the processing means, an instruction for transferring the data of the specific matrix (L·U) obtained in the processing means to the calculation means, and an instruction for repeating the calculations in the processing means until the solution satisfies the convergence condition. According to the device simulator of the present invention, it is possible to obtain the solution at a high speed.

Other objects and further features of the present invention will be apparent from the following detailed description when read in conjunction with the accompanying drawings.

BRIEF DESCRIPTION OF THE DRAWINGS

FIG. 1 is a cross sectional view showing an example of a MOSFET which is analyzed by a device simulator;

FIG. 2 is a diagram showing an analyzing region of the MOSFET which is analyzed;

FIG. 3 shows a matrix equation corresponding to a matrix equation (5) obtained with respect to each of discrete points in the analyzing region shown in FIG. 2;

FIG. 15 shows a structure table set with respect to the MOSFET shown in FIG. 1 in the second embodiment of the device simulation method.

DESCRIPTION OF THE PREFERRED EMBODIMENTS

Figure 4:
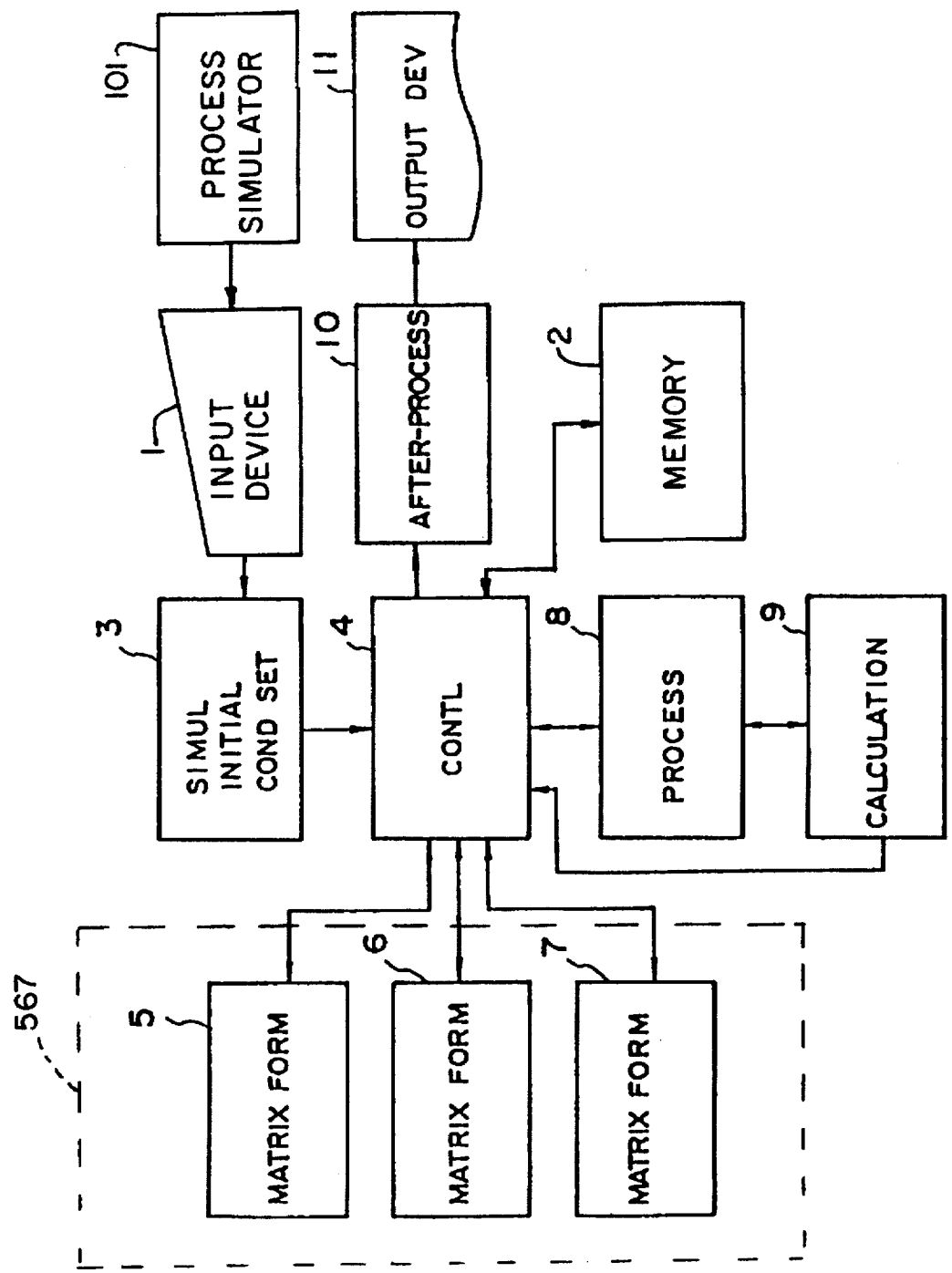
FIG. 4 is a system block diagram showing an embodiment of a device simulator according to the present invention for explaining an operating principle of the present invention.

FIG. 4 shows an embodiment of a device simulator according to the present invention for explaining an operating principle of the present invention. The device simulator has a process simulator 101, an input device 1, a memory 2, a simulation initializing condition input part 3, a simulation execution control part 4, matrix forming parts 5, 6 and 7 for respectively forming the Poisson's equation, the electron current continuity equation and the hole current continuity equation, an ILUCGS method processing part 8 for processing a matrix, an iteration method matrix calculation part 9, a simulation after-processing part 10, and an output device 11 for outputting a solution. For example, a single processor 567 functions as the matrix forming parts 5, 6 and 7.

Information input from the input device 1 includes structural information related to the structure and shape of the semiconductor device which is to be analyzed, internal information related to the semiconductor device and including at least information on the impurity distribution, specified information related to the analyzing region and the like. The information on the impurity distribution is received from the process simulator 101. Based on the information input from the input device 1, the simulation initializing condition input part 3 inputs to the simulation execution control part 4 initial values which are required for making the calculations. The initial values which are input are obtained for the zero bias voltage.

The simulation execution control part 4 generates at least an instruction for transferring the matrix data formed in the matrix forming parts 5, 6 and 7 to the ILUCGS method processing part 8, an instruction for transferring the data of the matrix (L·U) obtained in the ILUCGS method processing part 8 to the iteration method matrix calculation part 9, and an instruction for repeating the calculations in the ILUCGS method processing part 8 until the solution satisfies the convergence condition.

The memory 2 stores various data including intermediate data which are obtained during the calculation. In addition, the memory 2 may store models of semiconductor devices which may be analyzed on the device simulator. In this case, the model of the semiconductor device which is to be analyzed is selected from the input device 1. For example, the input device 1 is a keyboard and the output device 11 is a display device, and the analyzing conditions and the like are input from the input device 1. The analyzing conditions and the like may be input directly from the input device 1 or indirectly from the input device 1 by selecting the analyzing conditions and the like which are displayed on the output device 11.

The present invention is characterized by the formation of each coefficient matrix A in the matrix equations A·X=b which are formed in the respective matrix forming parts 5, 6 and 7 and the calculation process of the iteration method matrix calculation part 9, where X denotes the matrix to be solved and b denotes a known matrix.

A rectangular work region is assigned to the semiconductor device which is to be analyzed by fitting the semiconductor device into the rectangular work region regardless of the structure and shape of the semiconductor device when inputting the analyzing conditions and the like from the input device 1. For example, the rectangular work region is assigned to the semiconductor device when the data which are related to the semiconductor device and input from the input device 1 or the process simulator 101 are stored into the memory 2. Of course, it is also possible to assign the rectangular work region to the semiconductor device which is to be analyzed when inputting the data related to the semiconductor device.

Each of the matrix forming parts 5, 6 and 7 form as the coefficient matrix A a matrix having elements with respect to each of the discrete points in an analyzing region of the work region in which analyzing region the semiconductor device exists and also dummy elements. The dummy elements are elements with respect to each of the discrete points in a non-analyzing region of the work region in which non-analyzing region the semiconductor device does not exist, and the value of the elements making up a diagonal term is a positive integer while the value of other elements is "0". In other words, each of the matrix forming parts 5, 6 and 7 extracts the data in a specified region (rectangular region) of the analyzing region, which specified region is specified by the specified information of the analyzing region of the semiconductor device which is to be analyzed.

In addition, the iteration method matrix calculation part 9 calculates the elements of the matrix X by carrying out independent processes with respect to the analyzing region and the boundary region of the semiconductor device by applying the ILUCGS method using the matrix (L·U) which is obtained by the ILUCGS method.

Figure 5:
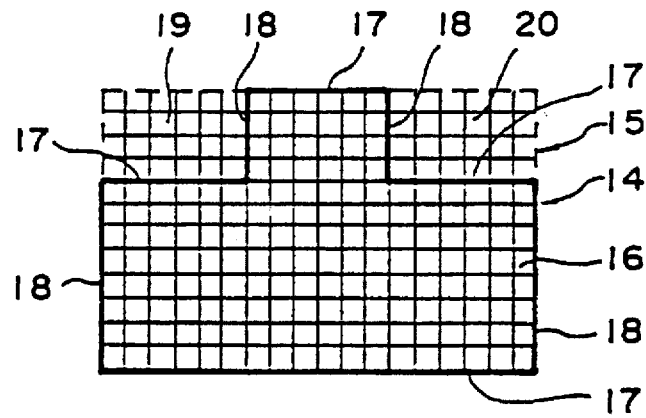
FIG. 5 shows a work region having an analyzing region corresponding to a semiconductor device to be analyzed.
Figure 6:
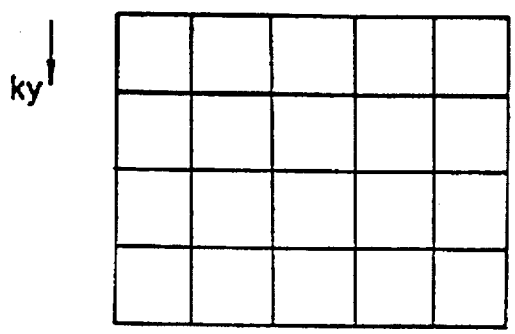
FIG. 6 shows a matrix equation which is formed with respect to the work region.

In a case where the structure of a semiconductor device 14 input from the input device 1 is as shown in FIG. 5 which is identical to the MOSFET shown in FIG. 1 described above, for example, the semiconductor device to be analyzed is fit into a rectangular work region 15 regardless of the structure of the semiconductor device and each of the matrix forming parts 5, 6 and 7 form a matrix equation A·X=b shown in FIG. 6.

In the work region 15 shown in FIG. 5, an analyzing region 16 in which the semiconductor 14 exists is defined by horizontal and vertical boundary regions 17 and 18, while the semiconductor device 14 does not exist in non-analyzing regions 19 and 20. The coefficient matrix A shown in FIG. 6 has the elements for each of the discrete points (intersections of the meshes) in the analyzing region 16 of the work region 15 and dummy elements D which are elements for each of the discrete points in the non-analyzing regions 19 and 20. Out of the elements with respect to each of the discrete points in the non-analyzing regions 19 and 20, the value of the elements making up a diagonal term is a positive integer (for example, "1") and the value of the other elements is "0".

The values of the dummy elements D are selected in this manner because there is a division by each element of the diagonal term of the coefficient matrix A in a latter process when carrying out the ILUCGS process in the ILUCGS method processing part 8 and an error would occur if the elements of the diagonal term were "0". In other words, a positive integer such as "1" is assigned to the dummy elements D of the diagonal term and "0" is assigned to the dummy elements D of a term other than the diagonal term. As a result, the elements x of the matrix X which are finally obtained by multiplication with the dummy elements D are all "0", and it is possible to prevent undesirable effects of the dummy elements D on the calculation.

On the other hand, by use of the dummy elements D, the period of the coefficient matrix A becomes constant regardless of the structure and shape of the semiconductor device 14, and the coefficient matrix A can be described by a matrix having bands of diagonal terms and a large number of zero components thereby enabling the simplification of the operation.

In addition, the Dirichlet condition (that is, setting V, n and p in the equation (1) to fixed values) is applied in the simulation initializing condition input part 3 with respect to the boundary region 17. Further, the Neumann condition (that is, setting the differential coefficient in the normal direction to "0") is applied with respect to natural boundaries at the right and left end portions 18 of the work region 16 in FIG. 5. Conventionally, these regions are treated as non-analyzing regions when actually calculating the coefficient matrix.

But during the processing in conformance with the ILUCGS method as will be described later, an error occurs between the direction vector which is obtained by taking the boundary region into consideration and the direction vector which is obtained by not taking the boundary region into consideration when calculating the direction vector which minimizes the error criterion. For this reason, the present invention forms the coefficient matrix A having the dummy elements D with respect to the boundary regions 17 and 18, similarly to the non-analyzing regions 19 and 20.

Therefore, it is possible to obtain the coefficient matrix A without being affected by a change in the structure and shape of the semiconductor device 14.

Figure 7A:
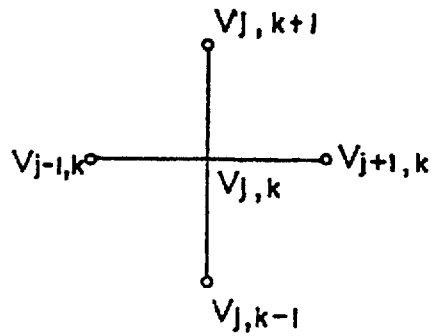
FIG. 7A shows a semiconductor device having a first shape divided by meshes.
Figure 7B:
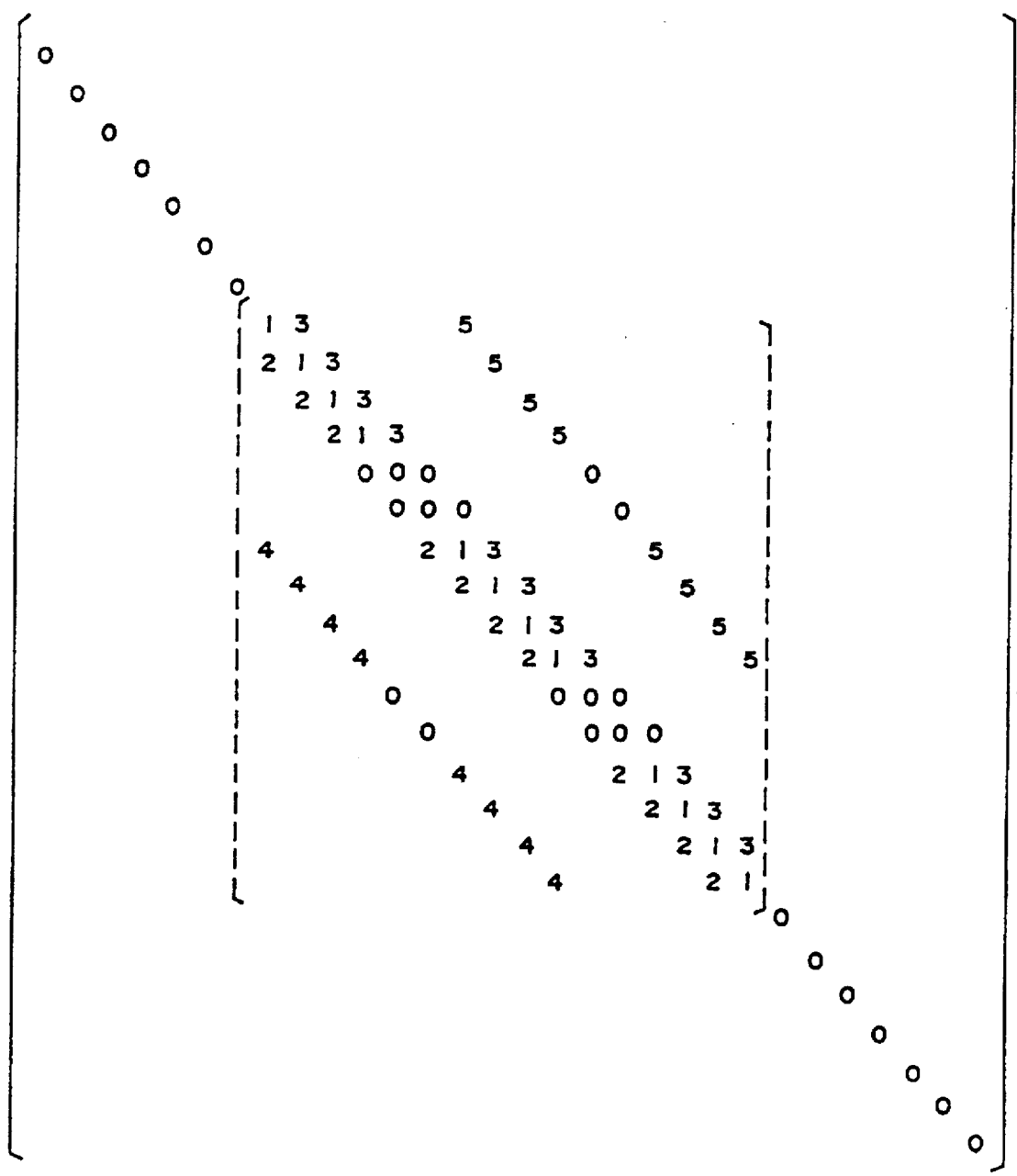
FIG. 7B shows a coefficient matrix A obtained with respect to the semiconductor device having the first shape shown in FIG. 7A.

FIG. 7A shows a semiconductor device having a first shape divided by meshes, and FIG. 7B shows a 30×30 coefficient matrix A obtained with respect to the semiconductor device having the first shape shown in FIG. 7A. In FIG. 7B, the values "1" through "6" respectively correspond to the coefficients $A_1$ through $A_6$ of the equation (4), the value "0" is the dummy element D, and the blank portion actually contain "0" although the illustration thereof is omitted. In addition, a phantom line indicates a 16×16 matrix portion corresponding to the analyzing region of the semiconductor device. As may be seen from FIG. 7B, there are five bands of diagonal terms in this case.

Figure 8A:
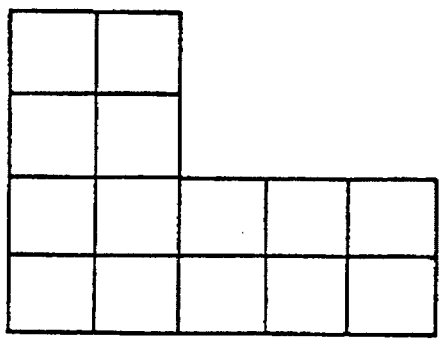
FIG. 8A shows a semiconductor device having a second shape divided by meshes.
Figure 8B:
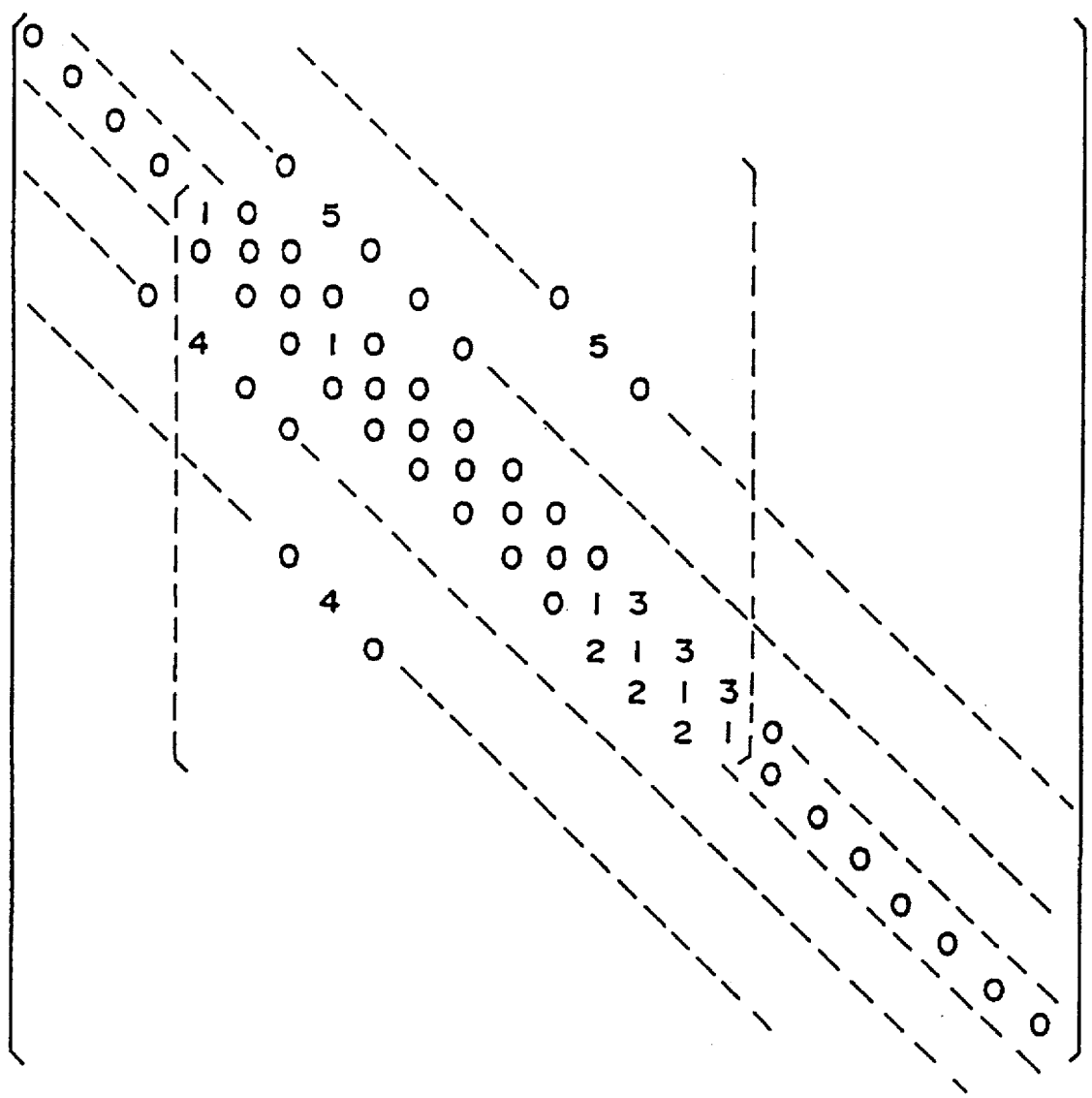
FIG. 8B shows a coefficient matrix A obtained with respect to the semiconductor device having the first shape shown in FIG. 8A.

FIG. 8A shows a semiconductor device having a second shape divided by meshes, and FIG. 8B shows a coefficient matrix A obtained with respect to the semiconductor device having the first shape shown in FIG. 8A. In FIG. 8B, the same designations are used as in FIG. 7B. As may be seen from FIG. 7B, there are seven bands of diagonal terms in this case.

The matrix equation formed in the matrix forming part 5 based on the Poisson's equation is supplied to the ILUCGS method processing part 8 under a control of the simulation execution control part 4. Hence, the coefficient matrix A is formed into the matrix (L·U) by the ILUCGS process which obtains a lower triangular matrix L and an upper triangular matrix U, and the matrix (L·U) is supplied to the iteration method matrix calculation part 9 wherein the CGS method is applied and the operation is repeated until a solution converges independently for the analyzing region 16 and the boundary regions 17 and 18 of the work region 15 so as to calculate the solution of each element x of the matrix X.

When the calculation of each element x of the matrix X ends, the solution is successively calculated in a similar manner with respect to the simultaneous equation formed in the matrix forming part 6 based on the electron current continuity equation and the simultaneous equation formed in the matrix forming part 7 based on the hole current continuity equation.

Figure 9:
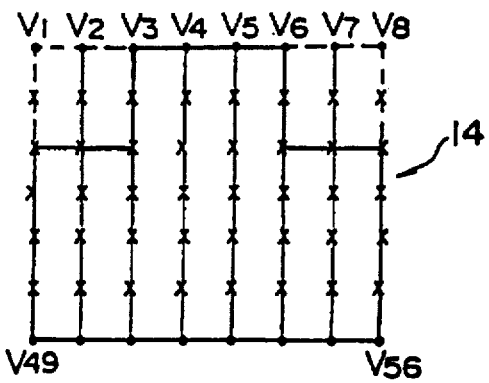
FIG. 9 shows discrete points in the work region of the semiconductor device to be analyzed.
Figure 10:
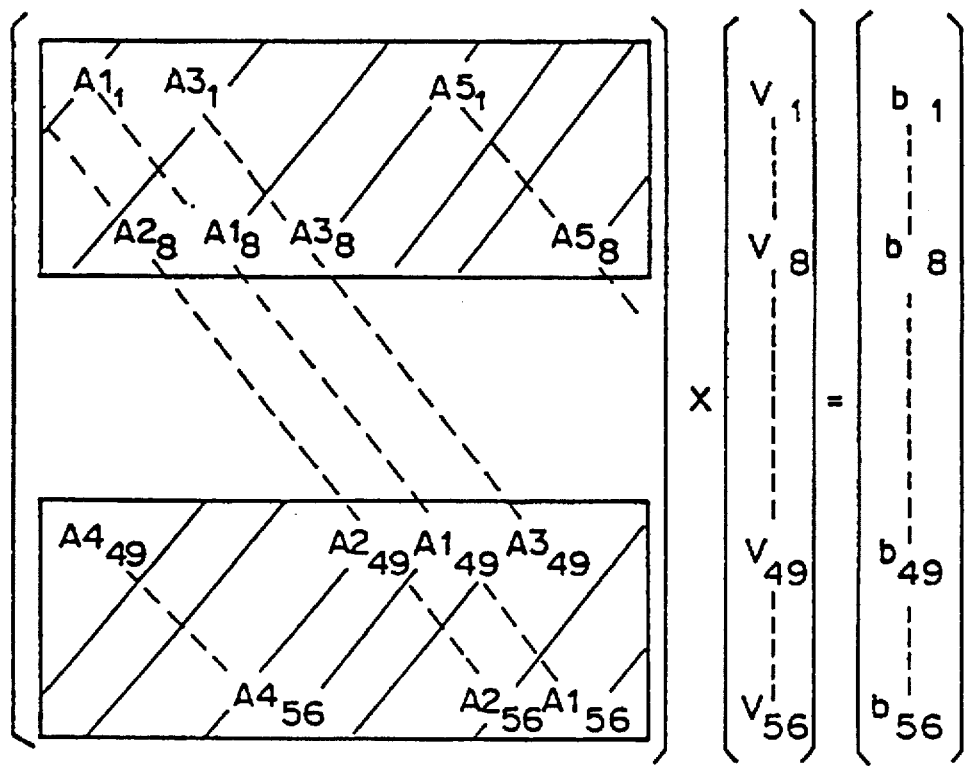
FIG. 10 shows a matrix equation formed with respect to the discrete points shown in FIG. 9.

Next, a description will be given of the independent processing in the iteration method matrix calculation part 9 with respect to the analyzing region 16 and the boundary regions 17 and 18. For convenience sake, it is assumed that there are in total 56 discrete points (analyzing points) in the work region 15 as shown in FIG. 9, that is, eight discrete points in the horizontal direction and seven discrete points in the vertical direction. The matrix equation becomes as shown in FIG. 10 when the potentials at the discrete points are denoted by $V_1, V_2, \ldots, V_{56}$. In FIG. 10, the coefficient matrix A on the left hand side is a 56 rows by 56 columns matrix, and a hatched portion denotes the coefficients in the boundary region and a blank portion denotes the coefficients in the analyzing region, where the illustration of these coefficients is omitted so as to simplify the drawing.

Normally, when carrying out the operation by use of a computer, an arrangement is assigned to each coefficient and a value is obtained from the arrangement when carrying out the calculation. It is assumed for convenience sake that the arrangement is assigned to the coefficient A1, and the elements of the arrangement are denoted by A1(1), A1(2), . . . , A1(56). A similar process is carried out with respect to the other coefficients.

In a case where an arbitrary calculation equation $r_0 = b - AX_0$ used during the processing in conformance with the ILUCGS method is calculated by use of the above arrangement, the calculation becomes as follows.

$$r_0(1) = b(I) - A1(I) \times X_0(I) - A2(I) \times X_0(I-1) - \quad (6)$$
$$A3(I) \times X_0(I+1) - A4(I) \times X_0(I-8) -$$
$$A5(I) \times X_0(I+8)$$

When carrying out this calculation with respect to all of the discrete points, a number I of the discrete points is varied from 1 to 56 because there are 56 discrete points as shown in FIG. 7.

For example, when I=1, $X_0(I-8)=X_0(-7)$. In addition, $X_0(I+8)=X_0(64)$ when I=56. Hence, this portion of the arrangement also needs to be secured as the work region 15, and in order to do so, the arrangement is set large in advance to A1(−7) through A1(64).

Alternatively, the calculation is successively carried out independently with respect to the boundary regions (I=1 to 8, and 49 to 56) and the analyzing region 16 (I=9 to 48). And, when carrying out the calculation with respect to the boundary regions, the term $A4(I) \times X_0(I-8)$ in the equation (6) is deleted when I=1 to 8 and the term $A5(I) \times X_0(I+8)$ in the equation (6) is deleted when I=49 to 56, so that A1(I) through A5(I) and b(I) can all be calculated by the 56 arrangements.

Therefore, according to the present invention, the solution obtained by the iteration method matrix calculation part 9 is output to the output device 11 through the simulation after-processing part 10 under the control of the simulation execution control part 4. The solution output from the output device 1 is then used to determine whether or not the analyzed semiconductor device is operational, that is, whether or not the analyzed semiconductor device operates as originally intended. The operability of the analyzed semiconductor device can be determined from the solution using a known method. For example, the Kirchhoff's current law (or Kirchhoff's first law) may be used to determine the operability of the analyzed semiconductor device from the solution, as described in S. M. Sze, "Physics of Semiconductor Devices", Second Edition, pp.134–140. Of course, the operability of the analyzed semiconductor device can be determined from the solution using the known method in the after-processing part 10 before being output from the output device 11. In this case, the simulation execution control part 4 carries out control operations similar to those described above for a different analyzing condition so as to simulate an operable semiconductor device in response to an output of the after-processing part 10.

Figure 11:
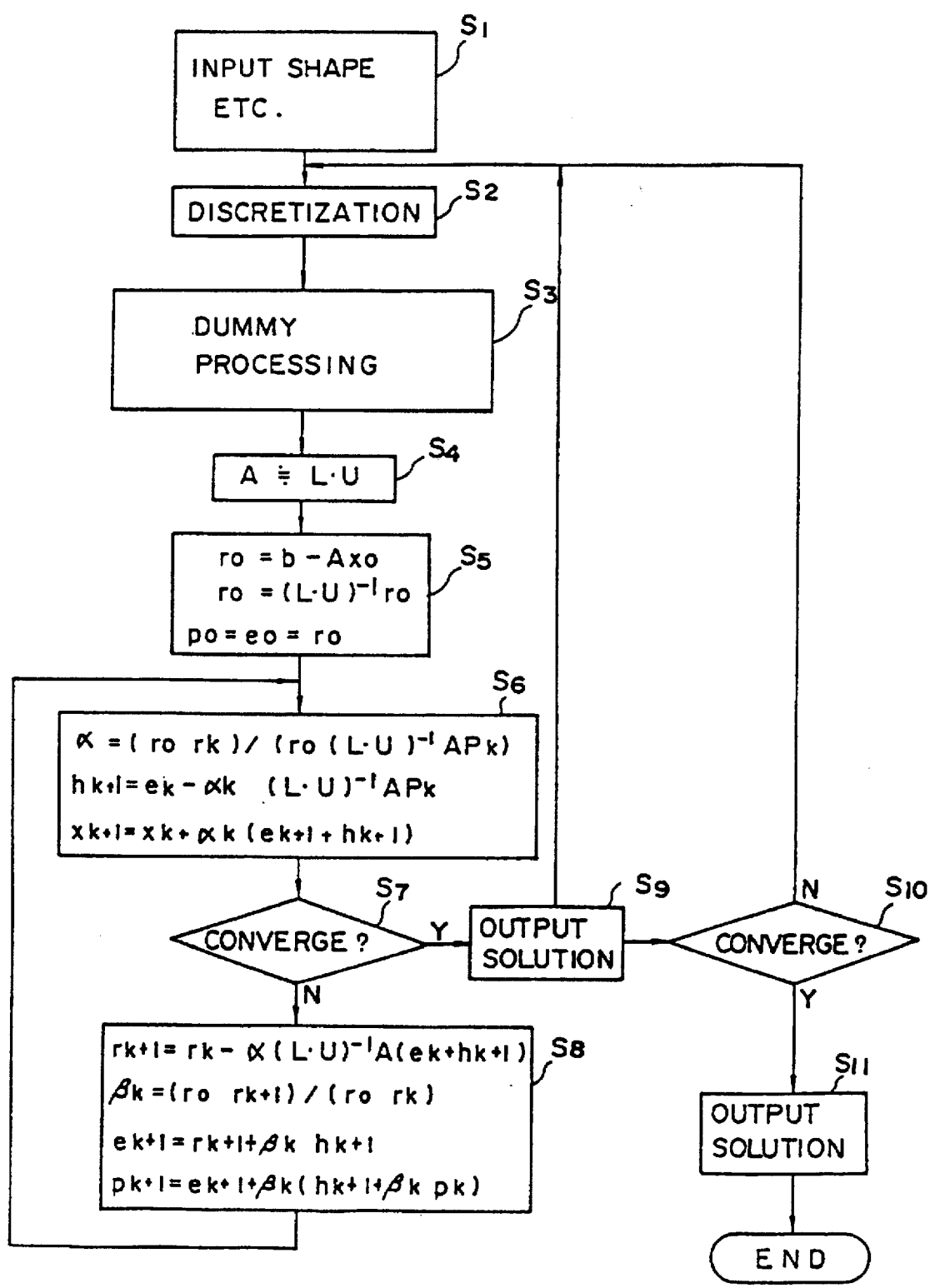
FIG. 11 is a flow chart for explaining an embodiment of a device simulation method according to the present invention.

Next, a description will be given of an embodiment of a device simulation method according to the present invention, by referring to FIG. 11. In FIG. 11, a step S1 inputs the fundamental equations, the structure and shape of the semiconductor device which is to be analyzed, the bias conditions, the impurity distribution, the boundary values, the initial values and the like. The analyzing conditions such as the fundamental equations, the structure and shape of the semiconductor device, the bias conditions, the impurity distribution and the boundary values are input to the simulation execution control part 4 from the input device 1. The input device 1 receives the impurity distribution from the process simulator 101. On the other hand, the initial values are input to the simulation execution control part 4 from the simulation initializing condition input part 3. A step S2 carries out the discretization of the Poisson's equation (1) in the matrix forming part 5 based on information obtained through the simulation execution control part 4, so as to obtain the matrix equation (5). Then, a step S3 inserts the dummy elements D into the coefficient matrix A as described above so as to obtain the coefficient matrix which is unaffected by the structure and shape of the semiconductor device.

Figure 12:
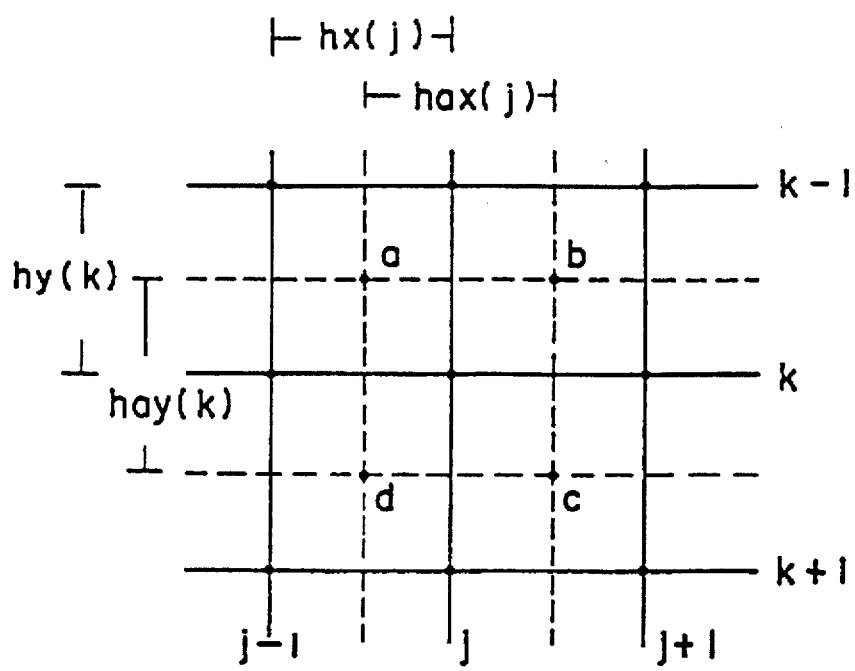
FIG. 12 is a diagram for explaining the discretization of the Poisson's equation.

A description will be given of the discretization of the Poisson's equation (1) in the step S2. In this embodiment, the discretization of the Poisson's equation (1) is made by use of the Newton method and the Box integration method in conformance with the finite difference calculus. In accordance with the meshes shown in FIG. 12, a region abcd having (j, k) as the center and surrounded by intermediate meshes is considered, and the Poisson's equation (1) is integrated for this region abcd as follows, where the charge quantity q is omitted for convenience sake because it is a constant.

$$\int_s \nabla(\epsilon \nabla V) dx dy = \int_s -(N_d + N_a + p - n) dx dy$$

From the Green's theorem, the surface integral on the left hand side of the above equation becomes a path (or line) integral and the following is obtained.

$$\int_s \nabla(\epsilon \nabla V) dx dy = \int_{abcd} \epsilon \nabla_n V dl$$

The right hand side of the above equation can be described as follows using the difference calculus.

$$\int_{abcd} \epsilon \nabla_n V dl = [\epsilon(j, k)hy(k)/2][V(j-1, k) - V(j, k)]/hx(j) + [\epsilon(j, k+1)hy(k+1)/2][V(j-1, k) - V(j, k)]/hx(j) +$$
$$[\epsilon(j+1, k)hy(k)/2][V(j+1, k) - V(j, k)]/hx(j+1) + [\epsilon(j+1, k+1)hy(k+1)/2][V(j+1, k) - V(j, k)]/hx(j+1) +$$
$$[\epsilon(j, k)hx(j)/2][V(j, k-1) - V(j, k)]/hy(k) + [\epsilon(j+1, k)hx(j+1)/2][V(j, k-1) - V(j, k)]/hy(k) +$$
$$[\epsilon(j, k+1)hx(j)/2][V(j, k+1) - V(j, k)]/hy(k+1) + [\epsilon(j+1, k+1)hx(j+1)/2][V(j, k+1) - V(j, k)]/hy(k+1)$$

On the other hand, when looking at the right hand side of the Poisson's equation (1) excluding the charge quantity q, the following equation can be obtained, where ρ(j,k) describes the carrier density and the impurity density at the point (j,k).

$$\int_s -(N_d + N_a + p - n) dx dy = -hax(j) \cdot hay(k) \cdot \rho(j, k)$$

As a result, it is possible to obtain the following difference equation (4a) with respect to V from the above equations, and this difference equation is identical to the equation (4) described above except for the notation.

$$A1(j,k)V(j,k) - A2(j,k)V(j+1,k) - A4(j,k)V(j+1,k) - A4(j,k)V(j,k-1) - A5(j,k)V(j,k+1) = A6 \quad (4a)$$

The coefficients with respect to V are as follows.

$A2=[(\epsilon(j,k)hy(k)/2)+\epsilon(j,k+1)hy(k+1)/2)](1/hx(j))$ $A3=[(\epsilon(j+1,k)hy(k)/2)+\epsilon(j+1,k+1)hy(k+1)/2)](1/hx(j+1))$ $A4=[(\epsilon(j,k)hx(j)/2)+\epsilon(j+1,k)hx(j+1)/2)](1/hy(k))$ $A5=[(\epsilon(j,k+1)hx(j)/2)+\epsilon(j+1,k+1)hx(j+1)/2)](1/hy(k+1))$ $A1=A2+A3+A4+A5$ $A6=hax(j)\cdot hay(k)\cdot \rho(j,k)$ Therefore, the hypercomplex simultaneous equation A·V=B can be formed. But in this state, the right hand term includes the carrier density and there is included a variable which must be solved in the form of $e^V$ and $e^{-V}$ thereby making the equation non-linear. Hence, in this embodiment, the Newton method is used. Generally, when obtaining the solution for $f(x)=0$ according to the Newton method, a differential function $f'(x)$ of $f(x)$ is used and the following operation is repeated for an initial value $x_0$.

$$f'(x_0)\cdot x_1 = -f(x_0) + f'(x_0)\cdot x_0$$
$$f'(x_1)\cdot x_2 = -f(x_1) + f'(x_1)\cdot x_1$$
$$\vdots$$
$$f'(x_{n-1})\cdot x_n = -f(x_{n-1}) + f'(x_{n-1})\cdot x_{n-1}$$

When the value of $x_n$ converges, $x_n$ is taken as the true value. As long as the function can be differentiated, the Newton method provides a numerical solution to a non-linear equation by setting an appropriate initial value. Hence, the difference equation (4a) can be transformed as follows by applying the Newton method.

First, an ith solution is denoted by $V^{(i)}$ and $f(V)$ is defined as follows.

$$f(V^{(i)}) = A1(j,k)V(j,k)^{(i)} - A2(j,k)V(j-1,k)^{(i)} -$$
$$A3(j,k)V(j+1,k)^{(i)} - A4(j,k)V(j,k-1)^{(i)} -$$
$$A5(j,k)V(j,k+1)^{(i)} - A6(j,k)V(j,k)^{(i)}$$

By applying the Newton method, the following is obtained.

$$f(V^{(i)}) + \sum_{j,k=1}^{total} [\partial f(V(j,k))/\partial V(j,k)]^{(i)} \cdot [V(j,k)^{(i+1)} - V(j,k)^{(i)}] = 0$$

The above may also be written as follows.

$A1(j,k)V(j,k)^{(i+1)} - A2(j,k)V(j-1,k)^{(i+1)} -$ $A3(j,k)V(j+1,k)^{(i+1)} - A4(j,k)V(j,k-1)^{(i+1)} -$ $A5(j,k)V(j,k+1)^{(i+1)} - A6(j,k)^{(i+1)} -$ $[\partial A6(j,k)/\partial V(j,k)]^{(i+1)}[V(j,k)^{(i+1)} - V(j,k)^{(i)}] = 0$ When the coefficients are replaced as follows, the equation (7) can be obtained.

$A'1(j,k)=A1(j,k)-[\partial A6(j,k)/\partial V(j,k)]^{(i)}$ $A'2(j,k)=A2(j,k)$ $A'3(j,k)=A3(j,k)$ $A'4(j,k)=A4(j,k)$ $A'5(j,k)=A5(j,k)$ $A'6(j,k)=A6(j,k)[V9j,k)^{(i)}]-[\delta A6(j,k)/\delta V(j,k)]^{(i)}V(j,k)^{(i)}$ $$A'6(j,k) = A6(j,k)[V9j,k)^{(i)}] - \tag{7}$$
$$[\partial A6(j,k)/\partial V(j,k)]^{(i)}V(j,k)^{(i)}$$

$A'1(j,k)V(j,k)^{(i+1)} - A'2(j,k)V(j-1,k)^{(i+1)} -$ $A'3(j,k)V(j+1,k)^{(i+1)} - A'4(j,k)V(j,k-1)^{(i+1)} -$ $A'5(j,k)V(j,k+1)^{(i+1)} = A'6(j,k)$

The equation (7) is a hypercomplex linear simultaneous equation. Thus, by calculating the equation (7) by successive approximation by use of an appropriate initial value, it is possible to obtain a true value.

A step S4 subjects the coefficient matrix A in the matrix equation which is based on the Poisson's equation (1) to the ILUCGS process in the ILUCGS method processing part 8 under the control of the simulation execution control part 4, and concentrates the fixed values in the diagonal terms. Hence, a solution is obtained for the elements x of the matrix X by applying the CGS method based on the matrix (L·U).

The algorithm itself of the ILUCGS method which is one of the iteration methods is known, and a description thereof will be omitted in the present specification. For example, the ILUCGS method is discussed in Sato et al., "High Convergence Matrix Solving Scheme for Device Simulator", Denshi Tsushin Gakkai Ronbunshi, '86/11 Vol.J69-C No.11, pp.1389–1396, 1986.

In other words, a step S5 uses an initial value $X_0$ of the approximate solution vector to calculate a residual vector $r_0$ in the iteration method matrix calculation part 9. A step S6 successively calculates in the iteration method matrix calculation part 9 by use of the residual vector $r_0$ a gradient $\alpha$ and a next solution vector $X_{k+1}$ by a kth reiteration, where $h_k$ denotes a (true) solution vector obtained by the kth reiteration in FIG. 11. Then, a step S7 discriminates in the iteration method matrix calculation part 9 whether or not the calculated solution converges. When the discrimination result in the step S7 is NO, a step S8 obtains in the iteration method matrix calculation part 9 a residual vector $r_{k+1}$ by the kth reiteration and compares it with the previous residual vector, and calculates a gradient $\beta_k$ and a direction vector $P_{k+1}$ so that an error vector obtained as a result of the comparison becomes a minimum, where $e_k$ denotes an error vector obtained by the kth reiteration and $e_k = h_k - X_k$ and $r_k = Ae_k$ in FIG. 11. The step S6 then newly obtains a next approximate solution vector in the iteration method matrix calculation part 9 by predicting an error from the true solution based on the direction vector $P_{k+1}$, and the step S7 again discriminates in the iteration method matrix calculation part 9 whether or not the calculated solution converges.

Similarly thereafter, the calculations in the steps S8 and S6 are repeated until the solution converges, and a step S9 outputs the solution from the iteration method matrix calculation part 9 when the discrimination result in the step S7 is YES. A step S10 discriminates in the simulation after-processing part 10 whether or not the solution converges. When the discrimination result in the step S10 is NO, the process returns to the step S2 and the processes of the steps S3 through S9 are carried out after obtaining the coefficient matrix inserted with the dummy elements D. In this case, the discrimination in the step S10 is again carried out with respect to the solution which is obtained. The processes are similarly repeated until the discrimination result in the step S10 becomes YES. When the discrimination result in the step S10 is YES, a step S11 outputs the solution to the output device 11 through the simulation after-processing part 10. The solution which is output to the output device 11 in this case is the solution to the matrix equation based on the Poisson's equation (1), and the potentials at each of the discrete points are obtained.

After the solution to the matrix equation based on the Poisson's equation (1) is obtained, the steps S2 through S11 successively obtain in a similar manner to the above the solution to the matrix equation based on the electron current continuity equation (2) and the solution to the matrix equation based on the hole current continuity equation (3). These solutions are similarly output to the output device 11 through the simulation after-processing part 10.

As described above, the operability of the analyzed semiconductor device is determined from the solutions output from the output device 11 using a known method.

Next, a description will be given of the discretization of the current continuity equation. In other words, the electron current continuity equations (8) and (9) are subjected to the discretization similarly to the discretization of the Poisson's equation (1) by use of the meshes shown in FIG. 12.

$$\nabla J_n = -(G-R) \tag{8}$$

$$J_n = \mu_n \cdot n_{ie} \cdot e^V \nabla [n(1/n_{ie})e^{-V}] \tag{9}$$

In the equation (8), $J_n$ denotes the electron current density, G denotes the carrier generation term and R denotes the carrier recombination term. In addition, in the equation (9), $\mu_n$ denotes the electron mobility, $n_{ie}$ denotes the intrinsic carrier density and n denotes the electron density. When the equation (9) is normalized by use of a quasi-potential $\Delta V$ which is generated by the band gap narrowing, $n_{ie}=\exp(\Delta V)$ and the following description can be made.

$$J_n = \mu_n e^{V+\Delta V}(n \cdot e^{-(V+\Delta V)})$$

When it is defined that $v=V+\Delta V$, the equation (8) can be written as the following equation (10).

$$\mu_n e^v \Delta(n \cdot e^{-v}) = -(G-R) \tag{10}$$

The following can be obtained of the left hand term first differential of the equation (11) by using the difference calculus with respect to the point (j,k).

$$\mu_n e^v \nabla(n \cdot e^{-v}) = \mu_{nj-1/2,k} \cdot e^{v_{j,k}}[(n_{j+1/2,k}e^{-v_{j+1/2,k}} - n_{j-1/2,k}e^{-v_{j-1/2,k}})/hx(j)] + \mu_{nj,k-1/2} \cdot e^{v_{j,k}}[(n_{j,k+1/2}e^{-v_{j,k+1/2}} - n_{j,k-1/2}e^{-v_{j,k-1/2}})/hy(k)]$$

Through further differential calculus of the above, the following can be obtained.

$$\nabla \mu_n e^v \nabla(n \cdot e^{-v}) = \mu_{nj,k}e^{v_{j+1/2,k}}[(n_{j+1,k}e^{-v_{j+1,k}} - n_{j,k}e^{-v_{j,k}})/hx(j+1)hax(j)] - \mu_{nj-1,k}e^{v_{j-1/2,k}}[(n_{j,k}e^{-v_{j,k}} - n_{j-1,k}e^{-v_{j-1,k}})/hx(j)hax(j)] + \mu_{nj,k}e^{v_{j,k+1/2}}[(n_{j,k+1}e^{-v_{j,k+1}} - n_{j,k}e^{-v_{j,k}})/hy(k+1)hay(k)] - \mu_{nj,k-1}e^{v_{j,k-1/2}}[(n_{j,k}e^{-v_{j,k}} - n_{j,k-1}e^{-v_{j,k-1}})/hy(k)hay(k)]$$

Then, the following definitions are made with respect to the values of $e^v$ on the intermediate meshes by using the Box integration.

$$e^{v_{j-1/2,k}} = (e^{v_{j,k}} - e^{v_{j-1,k}})/(v_{j,k} - v_{j-1,k})$$

$$e^{v_{j,k-1/2}} = (e^{v_{j,k}} - e^{v_{j,k-1}})/(v_{j,k} - v_{j,k-1})$$

$$e^{v_{j+1/2,k}} = (e^{v_{j+1,k}} - e^{v_{j,k}})/(v_{j+1,k} - v_{j,k})$$

$$e^{v_{j,k+1/2}} = (e^{v_{j,k+1}} - e^{v_{j,k}})/(v_{j,k+1} - v_{j,k})$$

On the other hand, the following can be obtained with respect to the right hand term of the equation (10), where $|J_{n,k}|$ and $|J_{pj,k}|$ denote currents in the direction of the field.

$$R_{j,k} - G_{j,k} = [(P_{j,k}n_{j,k} - (n_{iej,k})^2)/\tau_{pj,k}(n_{j,k} + n_{iej,k}) + \tau_{nj,k}(P_{j,k} + n_{iej,k})] + [C_p P_{j,k} + C_n n_{j,k})(P_{j,k}n_{j,k} - (n_{iej,k})^2)] - [a_n\exp(-b_n/|E_{j,k}|) \cdot U_{nj,k} + a_p\exp(-b_p/|E_{j,k}|) \cdot U_{pj,k}]$$

Therefore, the equation (10) can be rewritten as the following equation (11), where $A2_{j,k}$ and the like are as described below the equation (11).

$$A1_{j,k}n_{j,k} - A2_{j,k}n_{j-1,k} - A3_{j,k}n_{j+1,k} - \tag{11}$$

$$A4_{j,k}n_{j,k-1} - A5_{j,k}n_{j,k+1} = A6_{j,k}$$

$$A2_{j,k} = (\mu_{nj-1,k}/hx(j)hax(j))[(e^{v_{j-1,k}} - e^{v_{j,k}})/(v_{j-1,k} - v_{j,k})]e^{-v_{j-1,k}}$$

$$A3_{j,k} = (\mu_{nj,k}/hx(j+1)hax(j))[(e^{v_{j+1,k}} - e^{v_{j,k}})/(v_{j+1,k} - v_{j,k})]e^{-v_{j+1,k}}$$

$$A4_{j,k} = (\mu_{nj,k-1}/hy(k)hay(k))[(e^{v_{j,k-1}} - e^{v_{j,k}})/(v_{j,k-1} - v_{j,k})]e^{-v_{j,k-1}}$$

$$A5_{j,k} = (\mu_{nj,k}/hy(k+1)hay(k))[(e^{v_{j,k+1}} - e^{v_{j,k}})/(v_{j,k+1} - v_{j,k})]e^{-v_{j,k+1}}$$

$$A1_{j,k} = (\mu_{nj-1,k}/hx(j)hax(j))[(e^{v_{j-1,k}} - e^{v_{j,k}})/(v_{j-1,k} - v_{j,k})]e^{-v_{j,k}} + (\mu_{nj,k}/hx(j+1)hax(j))[(e^{v_{j+1,k}} - e^{v_{j,k}})/(v_{j+1,k} - v_{j,k})]e^{-v_{j,k}} + (\mu_{nj,k-1}/hy(k)hay(k))[(e^{v_{j,k-1}} - e^{v_{j,k}})/(v_{j,k-1} - v_{j,k})]e^{-v_{j,k}} + (\mu_{nj,k}/hy(k+1)hay(k))[(e^{v_{j,k+1}} - e^{v_{j,k}})/(v_{j,k+1} - v_{j,k})]e^{-v_{j,k}}$$

$$A6_{j,k} = G_{j,k} - R_{j,k}$$

Similarly as in the case of the Poisson's equation (1), the equation (11) is a non-linear equation and must be linearized by the Newton method. The term $A6_{j,k}$ is a function of $n_{j,k}$, $n_{j+1,k}$ and $n_{j,k+1}$, and the ith solution can be described by the following equation (12).

$$A1'_{j,k}n^{(i+1)}_{j,k} - A2'_{j,k}n^{(i+1)}_{j-1,k} - A3'_{j,k}n^{(i+1)}_{j+1,k} - A4'^{(i+1)}_{j,k}n_{j,k-1} - \tag{12}$$

$$A5'^{(i+1)}_{j,k}n_{j,k+1} = A6'^{(i)}_{j,k}$$

The coefficients can be described by the following.

$$A1'_{j,k} = A1_{j,k} - (\partial A6_{j,k}/\partial n_{j,k})^{(i)}$$

$$A2'_{j,k} = A2_{j,k}$$

$$A3'_{j,k} = A3_{j,k} - (\partial A6_{j,k}/\partial n_{j+1,k})^{(i)}$$

$$= A3_{j,k} - (\partial G_{j,k}/\partial n_{j+1,k})^{(i)}$$

$$A4'_{j,k} = A4_{j,k}$$

$$A5'_{j,k} = A5_{j,k} - (\partial A6_{j,k}/\partial n_{j,k+1})^{(i)}$$

$$= A5_{j,k} - (\partial G_{j,k}/\partial n_{j,k+1})^{(i)}$$

$$A6'_{j,k} = A6_{j,k} - (\partial A6_{j,k}/\partial n_{j,k})^{(i)} n_{j,k}^{(i)} -$$

$$(\partial A6_{j,k}/\partial n_{j+1,k})^{(i)} n_{j+1,k}^{(i)} -$$

$$(\partial A6_{j,k}/\partial n_{j,k+1})^{(i)} n_{j,k+1}^{(i)}$$

$$= A6_{j,k} + (\partial R_{j,k}/\partial n_{j,k})^{(i)} n_{j,k}^{(i)} -$$

$$(\partial G_{j,k}/\partial n_{j,k})^{(i)} n_{j,k}^{(i)} -$$

$$(\partial G_{j,k}/\partial n_{j+1,k})^{(i)} n_{j+1,k}^{(i)} -$$

$$(\partial G_{j,k}/\partial n_{j,k+1})^{(i)} n_{j,k+1}^{(i)}$$

The operation described heretofore with respect to the electron current continuity equation is similarly carried out with respect to the hole current continuity equation.

In this embodiment, the potential v which takes into account $\Delta V$ with respect to the solution V of the Poisson's equation is used when carrying out the discretization of the current continuity equation. Although the boundary condition is input with respect to V, no boundary condition is input with respect to $\Delta V$ and the solution cannot be obtained as it is. Hence, with respect to $\Delta V$, the Neumann condition is applied to all boundaries including the electrode, and the natural boundary processing is made so that the differential coefficient along the normal direction all become "0". As a result, the internal potential related to $\Delta V$ can be described as a closed system.

As described above, the processes of the steps S5 through S8 are carried out successively and independently with respect to the analyzing region 16 and the boundary regions 17 and 18 of the work region 15.

In the case where the discrimination result in the step S10 is NO, the steps S2 through S4 are carried out before reaching the step S5 wherein the initial value $X_0$ of the approximate solution vector is used. The calculation speed of the successive approximation in conformance with the ILUCGS method is greatly dependent on how close the initial value $X_0$ is to the actual solution.

Hence, in this embodiment, the result of the previous calculation (that is, the solution output in the step S9) is used as the initial value $X_0$ of the approximate solution vector used by the ILUCGS method. As a result, it is possible to improve the convergence of the solution.

Figure 13:
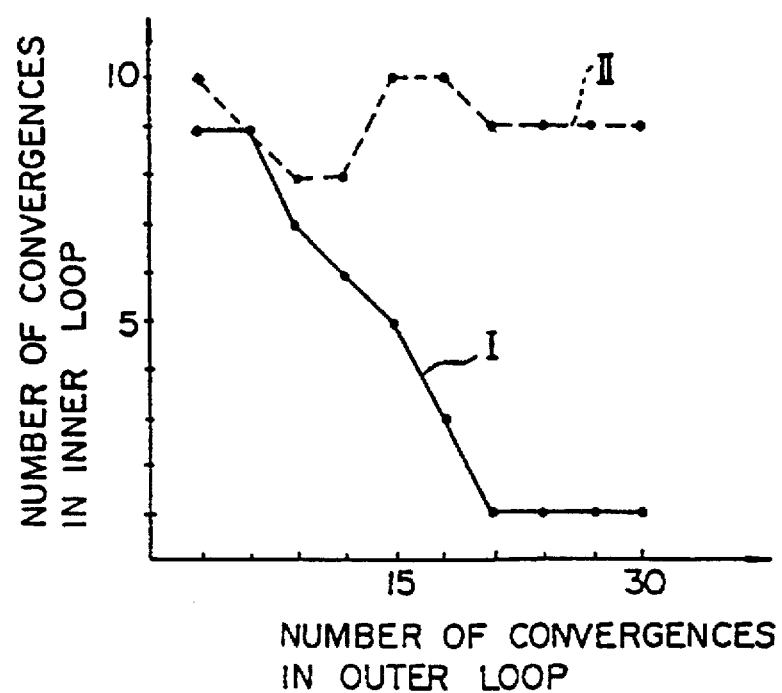
FIG. 13 shows simulation results obtained in the embodiment of the device simulation method with respect to the MOSFET shown in FIG. 1 when a drain voltage $V_D$ was increased with a step bias in comparison with simulation results obtained by the conventional device simulation.

According to experiments conducted by the present inventor, simulation results shown in FIG. 13 were obtained with respect to the MOSFET shown in FIG. 1 when a drain voltage $V_D$ was increased with a step bias with a gate voltage $V_G$ set to 4 V, a source voltage $V_S$ set to 0 V and a back gate voltage $V_{BG}$ set to −2 V. In FIG. 13, the ordinate indicates a number of convergences in an internal loop including the step S7 in FIG. 11 and the abscissa indicates a number of convergences in an external loop including the step S10 in FIG. 11. In this embodiment wherein the result of the previous calculation is used as the initial value $X_0$, a characteristic I indicated by a solid line is obtained. On the other hand, a characteristic II indicated by a phantom line is obtained when the initial value $X_0$ is always set to "0" as is the case of the conventional device simulation. It can be seen from the characteristic I in FIG. 13 that the calculation speed is high in this embodiment compared to the conventional device simulation which is described by the characteristic II.

In addition, the following Table shows the simulation results obtained with respect to the MOSFET shown in FIG. 1 according to this embodiment in comparison with the simulation results obtained by the conventional device simulations respectively using the Gaussian overrelaxation method and the successive overrelaxation (SOR) method.

TABLE

| Method | CPU Process Time up to $V_D$ = 7.2 V | Limit of Bias of $V_D$ | Total CPU Process Time |
|---|---|---|---|
| Gaussian | 2 hrs 45 min | 7.2 V | 2 hrs 45 min |
| SOR | 1 hr 40 min | 8.8 V | 2 hrs 19 min |
| Embodiment | 1 hr 2 min | 11.8 V | 1 hr 59 min |

As may be seen from the Table, the calculation time is considerably lower in this embodiment as compared to the calculation times of the conventional device simulations using the Gaussian overrelaxation method and the SOR method. According to this embodiment, it is possible to obtain the solution with a speed which is over approximately 1.5 times those of such conventional device simulations. In addition, the solution can be obtained in this embodiment with an extremely high accuracy even up to a high bias of the drain voltage $V_D$.

Figure 14:
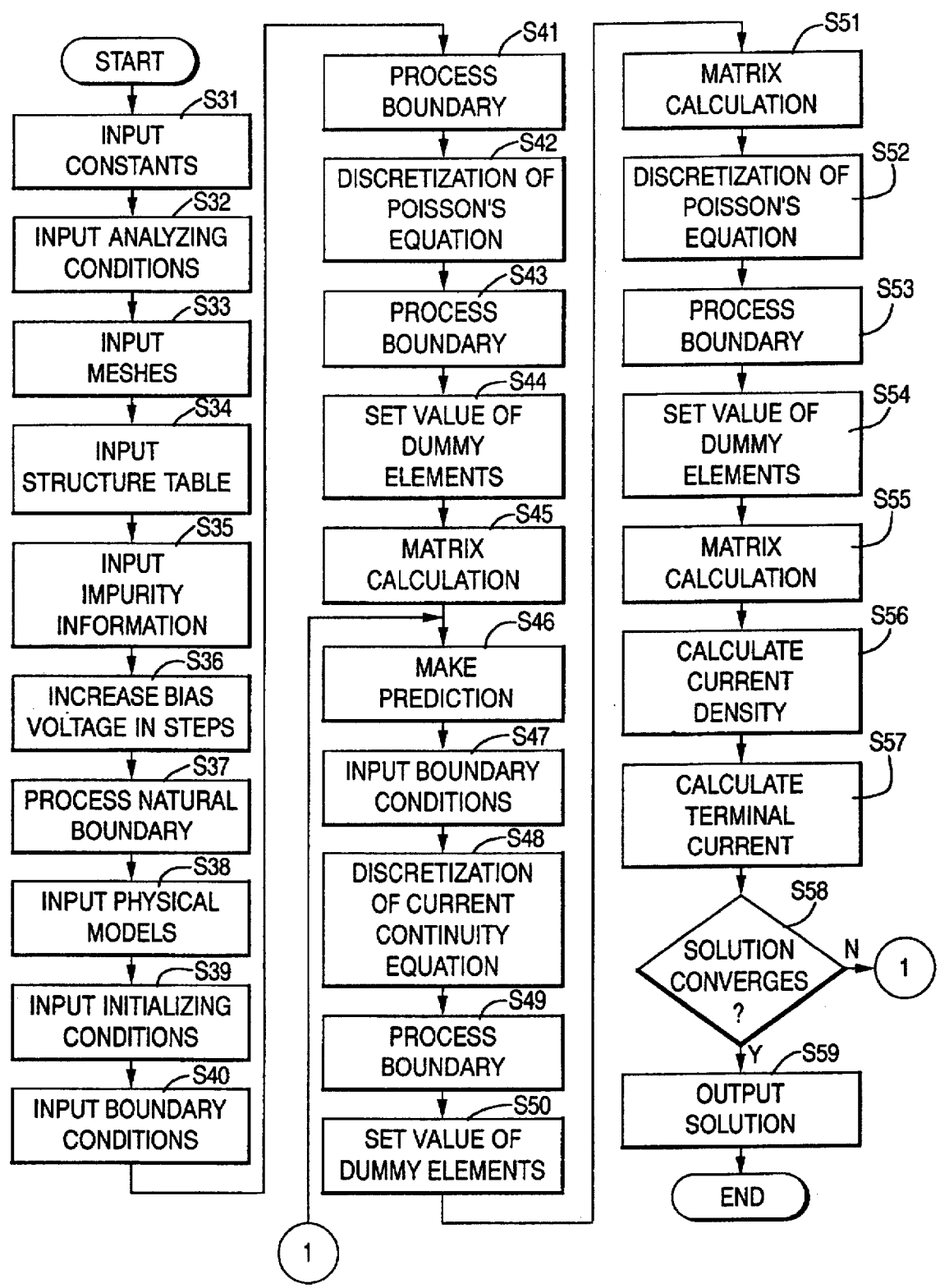
FIG. 14 is a flowchart for explaining another embodiment of the device simulation method according to the present invention.

Next, a description will be given of another embodiment of the device simulation method according to the present invention, by referring to FIG. 14. In FIG. 14, a step S31 inputs physical constants such as the temperature, Boltzmann constant and the like which are used in calculations. A step S32 inputs the analyzing conditions of the semiconductor device which is to be analyzed such as the structure and shape of the semiconductor device including shapes of elements of the semiconductor device, the transistor size, the terminal voltage, the bias voltage and the like. A step S33 inputs meshes which divide a rectangular work region in which the semiconductor device fits, so that simultaneous equations can be set up at the intersections of the meshes. The meshes may divide a region within the work region at regular intervals and/or at irregular intervals. For example, the potentials in a junction region of a transistor greatly differ and the meshes need to divide the junction region at fine intervals. Thus, the meshes may divide a portion of the work region at first intervals and divide another portion of the work region at second intervals different from the first intervals.

Figure 15:
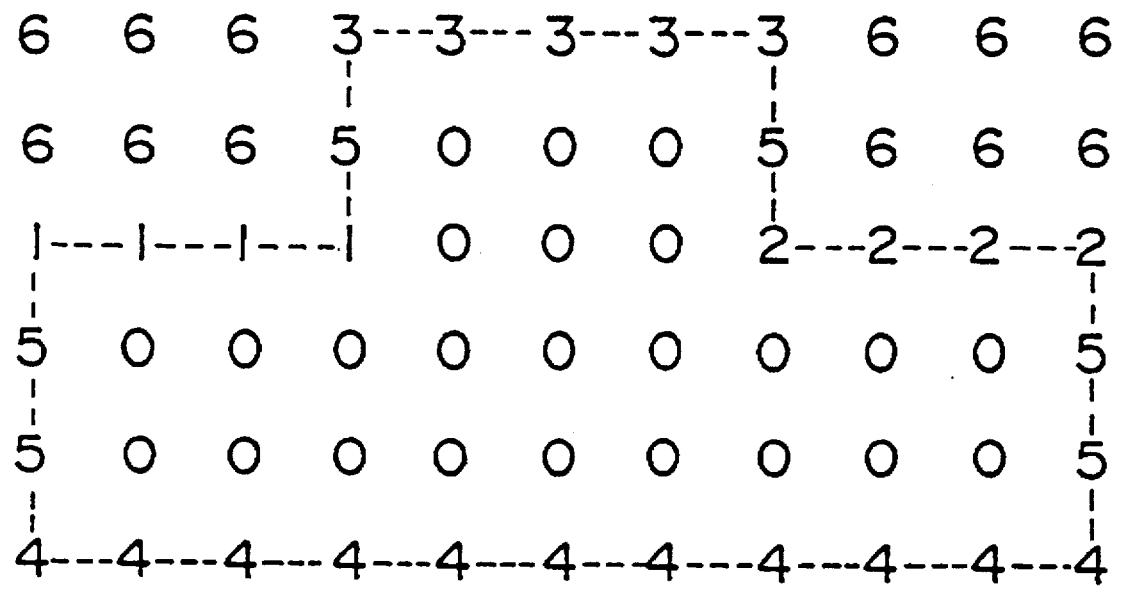

A step S34 inputs a structure (or shape) table which indicates which portion of the work region is to be analyzed and which portion of the work region does not need to be analyzed. In other words, the structure table indicates the analyzing and non-analyzing regions of the work region. FIG. 15 shows a structure table set with respect to the MOSFET shown in FIG. 1. In FIG. 15, codes "0" through "6" are shown at the intersections of the meshes to indicate the kinds of discrete points. The code "0" denotes an analyzing point, the code "1" denotes a source electrode point, the code "2" denotes a drain electrode point, the code "3" denotes a gate electrode point, the code "4" denotes a substrate electrode point, the code "5" denotes a natural boundary point, and the code "6" denotes a non-analyzing point. The shape of the semiconductor device is indicated by a phantom line.

A step S35 inputs impurity information related to impurities in the semiconductor device from the process simulator 101 via the input device 1 shown in FIG. 4. For example, the impurity information includes a quantity (value) of the impurity at various discrete points within the analyzing region of the work region. A step S36 inputs the steps with which the bias voltage is applied. As described above, the step S32 initially inputs a predetermined bias voltage to be applied to the semiconductor device, but the calculations cannot be carried out at once with respect to this predetermined bias voltage and the bias voltage needs to be increased in steps so as to make the calculations possible. Hence, the step S32 determines the steps with which the bias voltage is to be increased. A boundary process is carried out to process the natural boundary of the impurity region by assuming the outside of the impurity region to be non-analyzing points, and a step S37 inputs the differential coefficient in the normal direction to "0" in conformance with the Neumann condition. A step S38 inputs physical models indicative of the effects of the mobility, the effects of the band gap narrowing, the ionization rate, the life time and the like.

A step S39 inputs the initializing conditions, namely, an initial value of the carrier density. A value obtained by applying the potential to the Boltzmann distribution is used as the initial value. A step S40 inputs the boundary conditions such as the carrier density at the terminal electrode, the terminal voltage and the surface recombination effect. A boundary process is carried out to process the boundary of the carriers, and a step S41 inputs the differential coefficient to "0" with respect to the carriers. A step S42 carries out the discretization of the Poisson's equation (1) to solve the coefficients. Then, a step S43 carries out a boundary process with respect to the coefficients obtained in the step S42. A step S44 sets the value of the dummy elements D corresponding to the discrete points having the code "6" (that is, the discrete points within the non-analyzing region) in FIG. 15 to "0". Next, a step S45 carries out the matrix calculation based on the ILUCGS method.

The steps S31 through S41 substantially correspond to the step S1 of FIG. 11. The steps S42 and S43 substantially correspond to the step S2, and the step S44 substantially corresponds to the step S3. The step S45 substantially corresponds to the steps S4 through S9 carried out for the first time. Hence, the steps S42 through S45 substantially correspond to the steps S2 through S9 carried out for the first time.

The steps S39 through S45 are carried out to solve the Poisson's equation (1) in the zero bias voltage state, and the potential distribution and the carrier distribution are obtained to obtain the initial values.

Next, steps S46 through S51 are carried out to solve the current continuity equation by use of the solution obtained in the step S45. The step S46 makes a prediction based on the Gummel's iteration, and the step S47 inputs the boundary conditions similarly to the step S40. The step S48 carries out the discretization of the current continuity equation to solve the coefficients. The step S49 carries out a boundary process with respect to the coefficients obtained in the step S48 similarly to the step S43. The step S50 sets the value of the dummy elements D corresponding to the discrete points having the code "6" (that is, the discrete points within the non-analyzing region) to "0" similarly to the step S44. Next, the step S51 carries out the matrix calculation based on the ILUCGS method.

The steps S46 through S51 substantially correspond to the steps S2 through S9 carried out for the second time.

Then, steps S52 through S55 are carried out to solve the Poisson's equation (1) by use of the solution obtained in the step S51. The step S52 carries out the discretization of the Poisson's equation (1) to solve the coefficients. The step S53 carries out a boundary process with respect to the coefficients obtained in the step S52 similarly to the step S43. The step S54 sets the value of the dummy elements D corresponding to the discrete points having the code "6" (that is, the discrete points within the non-analyzing region) to "0" similarly to the step S44. Next, the step S55 carries out the matrix calculation based on the ILUCGS method.

The steps S52 through S55 substantially correspond to the steps S2 through S9 carried out for the third time.

A step S56 calculates the current density and a step S57 calculates the terminal current from the calculated current density with respect to each terminal electrode. A step S58 then discriminates whether or not the solution converges, and the process returns to the step S46 when the discrimination result in the step S58 is NO. But when the discrimination result in the step S58 is YES, a step S59 outputs the solution and the process is ended. The operability of the analyzed semiconductor device is thereafter determined by a known method based on the solution.

The step S58 corresponds to the step S10 shown in FIG. 11 which is carried out after the step S9 is carried out for the third time.

In the described embodiments, when obtaining the solution for the matrix X, the ILUCGS method is employed as the iteration method when carrying out calculations in conformance therewith by use of the matrix (L·U) until the convergence condition is satisfied. However, the iteration method employed is not limited to the ILUCGS method, and it is also possible to employ other iteration methods such as the successive overrelaxation (SOR) method.

According to the present invention, it is possible to obtain the following advantageous effects. First, it is possible to form a coefficient matrix which always has a constant period regardless of the construction and shape of the semiconductor device. Hence, the present invention is suited for general applications, and the solution of the matrix can be obtained at a high speed. Second, by considering the boundary region similarly to the non-analyzing region within the work region, that is, by carrying out the dummy processing with respect to the boundary region, it is possible to obtain in the process of solving in conformance with the iteration method (for example, ILUCGS method) the direction vector which takes into account the semiconductor device as a whole. Third, since the calculation in conformance with the iteration method (for example, ILUCGS method) is carried out independently for the boundary region and the analyzing region, it is possible to reduce the memory capacity required for the calculation when the calculations are sequentially carried out for the boundary region and the analyzing region. Fourth, because the result of the previous calculation is used as the initial value of the approximate solution vector used in the iteration method (for example, ILUCGS method), it is possible to obtain the solution within a short time compared to the case where the initial value is always set to a constant value.

Further, the present invention is not limited to these embodiments, but various variations and modifications may be made without departing from the scope of the present invention.

What is claimed is:

1. A device simulation method implemented in a computer for obtaining internal information at discrete points within a semiconductor device which is to be analyzed based on information related to the semiconductor device by forming a coefficient matrix A of a matrix equation A·X=b of physical equations with respect to each of the discrete points within the semiconductor device and solving the matrix equation, where X denotes a matrix of physical quantities to be obtained and b is a known matrix, said device simulation method comprising the steps of:

(a) assigning a rectangular work region to the semiconductor device regardless of a shape of the semiconductor device, said work region being a virtual region provided within a memory of the computer, said semiconductor device being fit within the work region and occupying an analyzing region within the work region where the semiconductor device is located;

(b) forming, in the computer, a matrix made up of elements with respect to each of the discrete points within the analyzing region of the work region of the semiconductor device and dummy elements with respect to each of the discrete points within a non-analyzing region unoccupied by the semiconductor device at least within the work region, said dummy elements having values substituted into the matrix such that the values of the dummy elements forming a diagonal term of the matrix respectively are a positive integer and remaining dummy elements respectively are "0";

(c) forming, in the computer, a matrix (L·U) by dividing the matrix into a lower triangular matrix L and an upper triangular matrix U;

(d) carrying out, in the computer, calculations in conformance with an iteration method stored therein by use of the specific matrix (L·U) until a convergence condition is satisfied, thereby obtaining a solution for each elements of the matrix X, intermediate calculation results being stored in the memory during the calculation; and (e) producing a signla indicative of whether or not the semiconductor device is operational based on the solution for each element of the matrix X obtained in said step (d).

2. The device simulation method as claimed in claim 1, wherein the matrix formed in said step (b) is related to one of potential of the Poisson's equation, electron density of the electron current continuity equation and hole density of the hole current continuity equation such that said step (b) calculates one of the potential, electron density and hole density within the semiconductor device.

3. The device simulation method as claimed in claim 2, wherein said step (d) employs a successive overrelaxation method as the iteration method.

4. The device simulation method as claimed in claim 2, wherein said step (d) employs an incomplete LU decomposition conjugate gradient squared method as the iteration method.

5. The device simulation method as claimed in claim 1, wherein said step (b) forms a mesh which divides the work region into a plurality of regions, said discrete points being respectively located at intersections of the mesh.

6. The device simulation method as claimed in claim 5, wherein the mesh divides an arbitrary portion of the work region at regular intervals, said arbitrary portion dividing at least the analyzing region within the work region.

7. The device simulation method as claimed in claim 5, wherein the mesh divides an arbitrary portion of the work region at irregular intervals, said arbitrary portion dividing at least the analyzing region within the work region.

8. The device simulation method as claimed in claim 5, wherein the mesh divides a first arbitrary portion at first intervals and divides a second arbitrary portion at second intervals different from the first intervals, said first and second arbitrary portions dividing at least the analyzing region within the work region.

9. The device simulation method as claimed in claim 1, wherein said step (b) includes providing in the matrix dummy elements with respect to each of the discrete points within a non-analyzing region which is unoccupied by the semiconductor device and is outside the work region.

10. The device simulation method as claimed in claim 1, wherein said step (b) includes providing in the matrix dummy elements with respect to each of the discrete points within a boundary region which defines the analyzing region.

11. The device simulation method as claimed in claim 10, wherein the boundary region includes a natural boundary of the semiconductor device, said natural boundary being a cut out boundary obtained when the analyzing region is cut out from a region which is actually occupied by the semiconductor device.

12. The device simulation method as claimed in claim 10, wherein said step (d) repeats calculations until a solution converges independently for the analyzing region and the boundary region, said solution for one of the analyzing region and the boundary region being calculated before the other one of the analyzing region and the boundary region is calculated.

13. The device simulation method as claimed in claim 1, wherein said step (d) carries out calculations independently for a first row in the work region having a discrete point from which a discretization of the physical equations starts and a second row having a discrete point where the discretization ends, said calculations being carried out for one of the first and second rows before carrying out the calculations for the other one of the first and second rows.

14. A computer-implemented device simulator for obtaining internal information at discrete points within a semiconductor device which is to be analyzed based on information related to the semiconductor device, said device simulator comprising:

an input device for inputting information related to the semiconductor device including at least structural information on a shape of the semiconductor device and information on analyzing condition;

an initial condition input device, operatively coupled to said input device, for inputting simulation initializing conditions including initial values based on the information input from said input device;

matrix forming means for forming a coefficient matrix A of a matrix equation A·X=b of physical equations with respect to each of the discrete points within the semiconductor device and solving the matrix equation by calculations initially using the initial values included in the simulation initializing conditions, where X denotes a matrix of physical quantities to be obtained and b is a known matrix, said matrix forming means including:

means for assigning a rectangular work region to the semiconductor device regardless of a shape of the semiconductor device so that the semiconductor device is fit within the work region and occupies an analyzing region within the work region, said analyzing region being a region within the work region where the semiconductor device is located; and means for forming a matrix made up of elements with respect to each of the discrete points within the analyzing region of the work region and dummy elements with respect to each of the discrete points within a non-analyzing region unoccupied by the semiconductor device at least within the work region, said dummy elements having such values that the dummy elements forming a diagonal term of the matrix respectively are a positive integer and remaining dummy elements respectively are "0";

processing means, operatively coupled to said matrix forming means, for forming a specific matrix (L·U) by dividing the matrix into a lower triangular matrix L and an upper triangular matrix U;

calculation means, operatively coupled to said processing means, for carrying out calculations in conformance with an iteration method by use of the specific matrix (L·U) until a convergence condition is satisfied, thereby obtaining a solution for each element of the matrix X, intermediate calculation results being stored in a memory during the calculation; and means, operatively coupled to said calculation means, for producing a signal indicative of whether or not the semiconductor device is operational based on the solution for each element of the matrix X obtained in said calculation means;

control means, operatively coupled to said initial condition input device, said matrix forming means, said processing means and said calculation means, for controlling operation sequences of said initial condition input device, said matrix forming means, said processing means and said calculation means, said control means generating at least an instruction for transferring data of the matrix formed in said matrix forming means to said processing means, an instruction for transferring the data of the specific matrix (L·U) obtained in said processing means to said calculation means, and an instruction for repeating the calculations in said processing means until the solution satisfies the convergence condition.

15. The computer-implemented device simulator as claimed in claim 14, wherein the matrix formed in said matrix forming means is related to one of potential determined by the Poisson's equation, electron density determined by the electron current continuity equation and hole density determined by the hole current continuity equation, and said matrix forming means calculates one of the potential, electron density and hole density within the semiconductor device.

16. The computer-implemented device simulator as claimed in claim 15, wherein said calculation means employs a successive overrelaxation method as the iteration method.

17. The computer-implemented device simulator as claimed in claim 15, wherein said calculation means employs an incomplete LU decomposition conjugate gradient squared method as the iteration method.

18. The computer-implemented device simulator as claimed in claim 14, wherein said matrix forming means forms a mesh which divides the work region into a plurality of regions, said discrete points being respectively located at intersections of the mesh.

19. The computer-implemented device simulator as claimed in claim 18, wherein said mesh divides an arbitrary portion of the work region at regular intervals, said arbitrary portion dividing at least the analyzing region within the work region.

20. The computer-implemented device simulator as claimed in claim 18, wherein said mesh divides an arbitrary portion of the work region at irregular intervals, said arbitrary portion dividing at least the analyzing region within the work region.

21. The computer-implemented device simulator as claimed in claim 18, wherein said mesh divides a first arbitrary portion at first intervals and divides a second arbitrary portion at second intervals different from the first intervals, said first and second arbitrary portions dividing at least the analyzing region within the work region.

22. The computer-implemented device simulator as claimed in claim 14, wherein said matrix forming means includes in the matrix dummy elements with respect to each of the discrete points within a non-analyzing region which is unoccupied by the semiconductor device and is outside the work region.

23. The computer-implemented device simulator as claimed in claim 14, wherein said matrix forming means includes in the matrix dummy elements with respect to each of the discrete points within a boundary region which defines the analyzing region.

24. The computer-implemented device simulator as claimed in claim 23, wherein said boundary region includes a natural boundary of the semiconductor device, said natural boundary being a cut out boundary obtained when the analyzing region is cut out from a region actually occupied by the semiconductor device.

25. The computer-implemented device simulator as claimed in claim 23, wherein said calculation means repeats calculations until a solution converges independently for the analyzing region and the boundary region, said solution for one of the analyzing region and the boundary region being calculated before the other one of the analyzing region and the boundary region is calculated.

26. The computer-implemented device simulator as claimed in claim 14, wherein said calculation means carries out calculations independently for a first row in the work region having a discrete point from which a discretization of the physical equations starts and a second row having a discrete point where the discretization ends, said calculations being carried out for one of the first and second rows before carrying out the calculations for the other one of the first and second rows.

27. The computer-implemented device simulator as claimed in claim 14, which further comprises means, operatively coupled to said control means, for determining whether or not the semiconductor device is operational using the solution for each element of the matrix X obtained in said calculation means.

* * * * *

UNITED STATES PATENT AND TRADEMARK OFFICE
CERTIFICATE OF CORRECTION

PATENT NO. : 5,684,723
DATED : Nov. 4, 1997
INVENTOR(S) : NAKADAI

It is certified that error appears in the above-identified patent and that said Letters Patent is hereby corrected as shown below:

Col. 10, line 65, delete Equation (4a) and replace with the following:

$$A1(j,k)V(j,k) - A2(j,k)V(j-1,k) - A3(j,k)V(j+1,k)$$
$$- A4(j,k)V(j,k-1) - A5(j,k)V(j,k+1) = A6 \qquad (4a)$$

Col. 11, line 60, change "A'(j,k) =" to --A'1(j,k) =--.

Col. 13, line 23, delete Equation (9) and replace with the following:

$$J_a = \mu_a \cdot n_b \cdot e^V \nabla[n(1/n_b)e^{-V}] \qquad (9)$$

Col. 15, lines 13-24, delete the last equation (7 lines) and replace with the following:

$$\begin{aligned}
A6'_{j,k} &= A6_{j,k} - (\partial A6_{j,k}/\partial n_{j,k})^{(i)} \\
&\quad n_{j,k}^{(i)} - (\partial A6_{j,k}/\partial n_{j+1,k})^{(i)} \\
&\quad n_{j+1,k}^{(i)} - (\partial A6_{j,k}/\partial n_{j,k+1})^{(i)} \\
&\quad n_{j,k+1}^{(i)} \\
&= A6_{j,k} + (\partial R_{j,k}/\partial n_{j,k})^{(i)} \\
&\quad n_{j,k}^{(i)} - (\partial G_{j,k}/\partial n_{j,k})^{(i)} \\
&\quad n_{j,k}^{(i)} - (\partial G_{j,k}/\partial n_{j+1,k})^{(i)} \\
&\quad n_{j+1,k}^{(i)} - (\partial G_{j,k}/\partial n_{j,k+1})^{(i)} \\
&\quad n_{j,k+1}^{(i)}
\end{aligned}$$

UNITED STATES PATENT AND TRADEMARK OFFICE
CERTIFICATE OF CORRECTION

PATENT NO. : 5,684,723
DATED : Nov. 4, 1997
INVENTOR(S) : NAKADAI

It is certified that error appears in the above-identified patent and that said Letters Patent is hereby corrected as shown below:

Col. 19, line 36 (Claim 1, line 36), change "signla" to --signal--.

Signed and Sealed this

Third Day of March, 1998

Attest:

Attesting Officer

BRUCE LEHMAN

Commissioner of Patents and Trademarks